United States Patent
Weber et al.

(10) Patent No.: US 8,456,771 B2
(45) Date of Patent: Jun. 4, 2013

(54) HOLDING ARRANGEMENT FOR AN OPTICAL ELEMENT

(75) Inventors: Ulrich Weber, Ulm (DE); Hubert Holderer, Oberkochen (DE)

(73) Assignees: Carl Zeiss Laser Optics GmbH, Oberkochen (DE); Carl Zeiss SMT GmbH, Oberkochen (DE)

( * ) Notice: Subject to any disclaimer, the term of this patent is extended or adjusted under 35 U.S.C. 154(b) by 8 days.

(21) Appl. No.: 13/359,368

(22) Filed: Jan. 26, 2012

(65) Prior Publication Data

US 2012/0140341 A1    Jun. 7, 2012

Related U.S. Application Data

(63) Continuation of application No. PCT/EP2010/004514, filed on Jul. 23, 2010.

(30) Foreign Application Priority Data

Jul. 31, 2009    (DE) .................. 10 2009 037 133

(51) Int. Cl.
*G02B 7/02* (2006.01)
*E04G 3/00* (2006.01)

(52) U.S. Cl.
USPC ................. 359/822; 359/811; 248/276.1

(58) Field of Classification Search
USPC ............... 359/811, 813, 822; 248/123.11, 248/124.1, 277.1; 74/103, 490.01–490.05, 74/521; 901/15, 21, 23, 25; 403/52, 58
See application file for complete search history.

(56) References Cited

U.S. PATENT DOCUMENTS

| 3,291,431 | A | * | 12/1966 | Daniel, Jr. ................. 248/277.1 |
| 4,684,088 | A | * | 8/1987 | Heller ......................... 248/123.2 |
| 5,220,460 | A | | 6/1993 | Bedzyk |
| 7,764,447 | B2 | * | 7/2010 | Shibazaki ..................... 359/822 |
| 8,035,903 | B2 | * | 10/2011 | Weber et al. .................. 359/811 |
| 2003/0051331 | A1 | | 3/2003 | Amatucci et al. |
| 2009/0207511 | A1 | | 8/2009 | Schoeppach et al. |

FOREIGN PATENT DOCUMENTS

| DE | 200 12 046 US1 | 9/2000 |
| JP | 2002-72057 | 3/2002 |
| WO | WO 2006/066706 | 6/2006 |
| WO | WO 2006/119970 | 11/2006 |
| WO | WO 2007/017013 | 2/2007 |

OTHER PUBLICATIONS

The International Preliminary Report on Patentability for corresponding PCT Appl No. PCT/EP2010/004515, dated Jan. 31, 2012.
The International Search Report and Written Opinion for corresponding PCT Appl No. PCT/EP2010/004515, dated Sep. 22, 2011.
German office action, with English translation, for corresponding DE Appl No. 10 2009 037 133.8, dated Apr. 21, 2010.

* cited by examiner

*Primary Examiner* — Loha Ben
(74) *Attorney, Agent, or Firm* — Fish & Richardson P.C.

(57) ABSTRACT

A holding arrangement for an optical element includes a basic structure surrounding an optical element and a mounting device by which the optical element can be supported on the basic structure with two degrees of freedom for a rotational movement about an optical axis and a translational movement along a first axis which extends perpendicularly to the optical axis and intersects the optical axis in a center. The mounting device includes four joint locations arranged point-symmetrically with respect to the center and at least one parallel rocker which is displaceable parallel to the first axis. A manipulator unit includes a holding arrangement.

20 Claims, 5 Drawing Sheets

HOLDING ARRANGEMENT FOR AN OPTICAL ELEMENT

CROSS-REFERENCE TO RELATED APPLICATIONS

This application is a continuation of, and claims benefit under 35 USC 120 to, international application PCT/EP2010/004514, filed Jul. 23, 2010, which claims benefit under 35 USC 119 of German Application No. 10 2009 037 133.8, filed Jul. 31, 2009. International application PCT/EP2010/004514 is hereby incorporated by reference in its entirety.

FIELD

The disclosure relates to a holding arrangement for an optical element with a basic structure surrounding the optical element and a mounting device by which the optical element can be supported on the basic structure. The disclosure further relates to a manipulator unit for an optical system including a holding arrangement.

BACKGROUND

Holding arrangements for optical elements are used in optical systems. The precision desired for mounting is generally dependent on the respective purpose of use.

An assembly for mounting an optical component relative to a carrier via at least three articulation points arranged at the outer circumferential region of the optical element is known from WO 2007/017013 A2, the optical element being held in a force-fitting manner by elastically resilient elements via the articulation points in at least one direction. The elastically resilient elements are located in this case in mounting device which hold the optical element in a statically determined manner.

An adjustable mount for a cylindrical lens in an optical system, for example the optical system of a laser printer, is known from U.S. Pat. No. 5,220,460. The mount includes a carrier element which is arranged perpendicularly to the optical axis (z axis) and has a flat face on which the cylindrical lens rests under the action of a constant force. A radius of curvature of the cylindrical lens is referred to in U.S. Pat. No. 5,220,460 as the y axis. An axis extending parallel to an axial direction of the cylindrical lens is referred to as the x direction. The adjustable mount is intended to allow a rotational movement about the optical axis and a translational movement in the direction of curvature for an adjustment. For this purpose, the cylindrical lens is mounted at two corners opposing each other in the x-y plane by a rib acting as a joint, a spring element and two set screws. Tilting about the two axes extending perpendicularly to the optical axis is on the other hand to be sufficiently ensured by the flat face on which the cylindrical lens rests for application in a laser printer.

Optical elements are also used in material processing devices, for example in laser annealing devices. An optical system of this type is described for example in WO 2006/066706. In devices of this type, a laser beam is used in order to fuse a layer for example, in particular a silicon layer, onto a substrate. In this case, the laser beam impinges onto the layer to be fused as a very narrow line beam. The layer and the laser beam are displaced relative to each other transversely to a line formed by the laser beam, so that the laser beam is guided in a planar manner over the substrate, which is known as the "panel".

As these devices illuminate the panel with a long, but very narrow field, cylindrical lenses, i.e. lenses having just one direction of curvature, are used.

Applications of this type generally demand very high precision. To prevent or at least to keep low deformations on account of heating of the system, it is known to use materials having a low coefficient of thermal expansion, for example Invar. However, materials of this type can be very expensive.

SUMMARY

The disclosure provides a holding arrangement for an optical element that prevents or at least reduces undesirable displacement and/or rotation or decentring of the optical element, in particular due to heating.

According to one aspect of the disclosure, a holding arrangement for an optical element includes a basic structure surrounding an optical element and a mounting device by which the optical element can be supported on the basic structure with two degrees of freedom for a rotational movement about an optical axis and a translational movement along a first axis which extends perpendicularly to the optical axis and intersects the optical axis in a center. The mounting device includes four joint locations arranged point-symmetrically with respect to the center and at least one parallel rocker which is displaceable parallel to the first axis. The point-symmetrical arrangement of the joint locations prevents the received optical element from becoming decenterd during expansion on account of heating. The degrees of freedom of the mounting device ensure that adjustment is possible. In one embodiment, two parallel rockers are provided which are coupled with the optical element so that a movement of the parallel rockers in opposite directions causes a rotational movement of the optical element about the optical axis.

The holding arrangement is advantageous in particular for cylindrical lenses, as cylindrical lenses have two extremely sensitive centring directions. In particular, rotational displacements about the optical axis and translational displacements parallel to a direction of curvature, i.e. perpendicularly to a cylinder axis, have a significant influence in cylindrical lenses on the accuracy of the associated optical system. The holding arrangement according to the disclosure therefore has appropriate degrees of freedom to allow an adjustment in these directions.

An inner structure, which carries an optical element to be mounted and on which the mounting device acts, is preferably provided. The inner structure is securely connected to the optical element. In one configuration, the inner structure is configured in a plate-like manner and has an aperture for an incident light beam. The inner structure is configured for example circularly or elliptically. Furthermore, substantially rectangular inner structures are advantageous for receiving cylindrical lenses. In other configurations, the inner structure includes a plurality of components, each partially carrying the optical element.

Preferably, the joint locations each have a pivot arm coupling the inner structure to the basic structure. The pivot arms are each articulated to the basic structure, preferably so as to be rotatable about an axis extending parallel to the optical axis. For example, articulation is carried out via a uniaxial pivot joint or via a fixed body tilting joint. An adjusting movement for an adjustment is transmitted to the inner structure and thus the optical element via the pivot arms.

In an advantageous configuration, pivot arms are each connected to the inner structure via at least one coupling rod. The coupling rod has at its ends preferably in each case a pivot joint or a fixed body tilting joint. In another configuration, the pivot arms are connected to the inner structure, in each case via at least one leaf spring joint. The coupling rods or a corresponding leaf spring joint are each arranged substantially perpendicularly to a connecting line between the associated joint location and the center in a basic position. In other words, the coupling rods are arranged substantially tangentially to an imaginary periphery around the center through the joint locations in the basic position. During expansion, it is therefore possible for the coupling rods to yield in the radial direction of the imaginary periphery and thus to compensate for the expansion on account of the heating without decentring.

Preferably at least one pivot arm (e.g., two pivot arms) is(/are) articulated to the at least one parallel rocker. In this case, the pivot arms are linked to the parallel rockers preferably so that the two pivot arms perform a rotation in the same direction during displacement of the parallel rocker. Rotation of the pivot arms in opposite directions is in this case prevented by the linking to the parallel rocker. In one embodiment, two parallel rockers are provided to each of which at least one pivot arm (two pivot arms) is(/are) articulated so that a movement of the parallel rockers in opposite directions causes a rotational movement of the optical element about the optical axis. In an advantageous configuration, the parallel rocker is connected to the basic structure via two coupling rods which preferably each having at their two ends a pivot joint or a tilting joint. The parallel rocker forms in this case a parallelogram with the coupling rods and the basic structure in a plane perpendicular to the optical axis, so that linear displaceability of the parallel rocker is implemented in a simple manner. The pivot arm or arms is/are linked to the associated parallel rocker preferably via a coupling rod. In particular, coupling rods arranged parallel to the parallel rockers, at least in a basic position, are advantageous for good introduction of movement or displacement.

The mounting device is preferably mirror-symmetric to the first axis and/or a second axis which extends perpendicularly to the first axis and the optical axis. In this case, simple compensation for expansion of the inner structure and/or the optical element on account of heating is achieved by identical or at least functionally equivalent components.

In a further configuration, at least one adjusting unit acting on the at least one parallel rocker is provided. Preferably, at least two adjusting units, which each act on a parallel rocker, are provided. In other configurations, two adjusting units act on each parallel rocker for displacement in a positive and a negative direction. For adjustment of the optical element, it is possible to displace the two parallel rockers in the same direction or in opposite directions by the adjusting units. Depending on the type of the setting engagement, an orientation of the optical element is in this case adjusted accordingly. In relation to the disclosure, the adjusting units which can be used are any desired manually, force and/or motor-actuatable setting mechanism, including set screws, pneumatically and/or hydraulically actuatable pistons, electromotive setting drives and/or the like. The optical elements are also held in a statically determined orientation the adjusting units.

The object is also achieved by a manipulator unit with a holding arrangement according to the disclosure. A manipulator unit of this type can for example advantageously be used in a system according to WO 2006/066706.

The foregoing and further features emerge not only from the claims but also from the description and the drawings, wherein the individual features can each be realized separately or in combination in the form of sub-combinations in embodiments of the disclosure and in other fields and can represent advantageous and also independently patentable embodiments.

DETAILED DESCRIPTION

Figure 1:
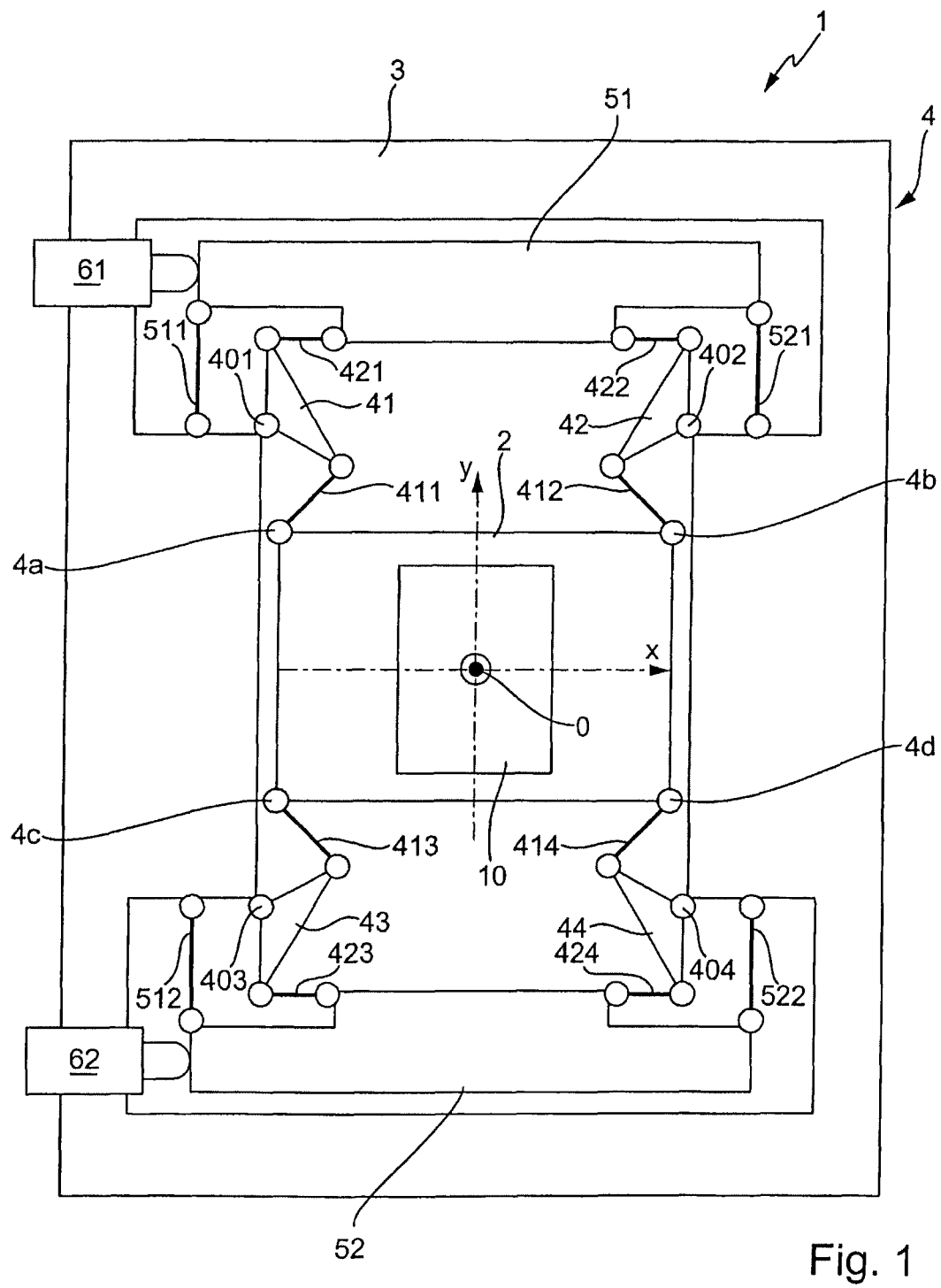
FIG. 1 is a schematic plan view onto a manipulator unit without displacements or rotation of the optical element.

FIG. 1 is a schematic plan view onto a manipulator unit 1 for an optical element 10. The optical element 10 is for example a cylindrical lens.

FIG. 1 shows a Cartesian coordinate system with the center 0 and the coordinates x, y and z. A direction of light or optical axis is in this case referred to as the z axis. A direction of curvature of the cylindrical lens is referred to as the x axis and an axis extending parallel to the axial direction of the cylindrical lens (cylinder axis) is referred to as the y axis.

A cylindrical lens has essentially two sensitive centring directions, namely a rotational movement about the optical axis, i.e. the z axis extending perpendicularly to the sheet direction, and a displacement in a direction of curvature, i.e. along the x axis.

The illustrated manipulator unit 1 includes a holding arrangement with an outer or basic structure 3 and a mounting device 4 which supports the optical element 10 on the basic structure 3. In the illustrated exemplary embodiment, the optical element 10 is arranged on an inner structure 2, the mounting device 4 coupling the inner structure 2 to the basic structure. The mounting device 4 includes four joint locations 4a, 4b, 4c, 4d arranged point-symmetrically to the center 0 of the Cartesian coordinate system. In the illustrated exemplary embodiment, the inner structure 2 is rectangularly embodied, viewed from above, the joint locations 4a to 4d acting at the four corners of the inner structure 2. In addition, the mounting device 4 is mirror-symmetrical to the x axis and to the y axis.

The mounting device 4 further includes two parallel rockers 51, 52 which are arranged on the basic structure 3 so as to be displaceable parallel to the x axis. The parallel rockers 51, 52 are linked to the basic structure 3 in this case coupling rods 511, 512, 521, 522, two coupling rods 511, 521 and 512, 522 respectively being provided for each of the two parallel rockers 51 and 52 respectively. The coupling rods 511, 521 and 512, 522 respectively form a parallelogram with the respectively associated parallel rocker 51 or 52.

An adjusting unit 61 or 62, by way of which the parallel rockers 51, 52 are displaceable parallel to the x axis, acts on each of the parallel rockers 51, 52. The two parallel rockers 51, 52 are arranged mirror-symmetrically to the x axis.

The joint locations 4a, 4b, 4c, 4d each include a pivot arm 41, 42, 43, 44 which is connected to the basic structure 3 via a pivot joint 401, 402, 403, 404 and is articulated to the associated parallel rocker 51, 52 and to the inner structure 2.

The pivot arms 41 to 44 are linked to the parallel rockers 51, 52 and to the inner structure 2 in this case by coupling rods 411, 412, 413, 414, 421, 422, 423, 424. Linking of the pivot arms 41 to 44 to the parallel rockers 51, 52 is in this case selected in such a way that two pivot arms 41, 42 and 43, 44 respectively associated with a parallel rocker 51 or 52 carry out rotation in the same direction during a displacement of the parallel rocker 51 or 52 parallel to the x axis. Rotation of the pivot arms 41, 42 and 43, 44 respectively, which are attached to a parallel rocker 51 or 52, in opposite directions is on the other hand prevented by the linking to the parallel rocker 51 or 52. The pivot arms 41, 42, 43, 44 transmit a movement of the parallel rockers 51, 52 to the inner structure 2. The coupling rods 421, 422, 423, 424 between the parallel rockers and the pivot arms 41, 42, 43, 44 are each arranged substantially parallel to the parallel rockers 51, 52 in an illustrated basic position.

Figure 2:
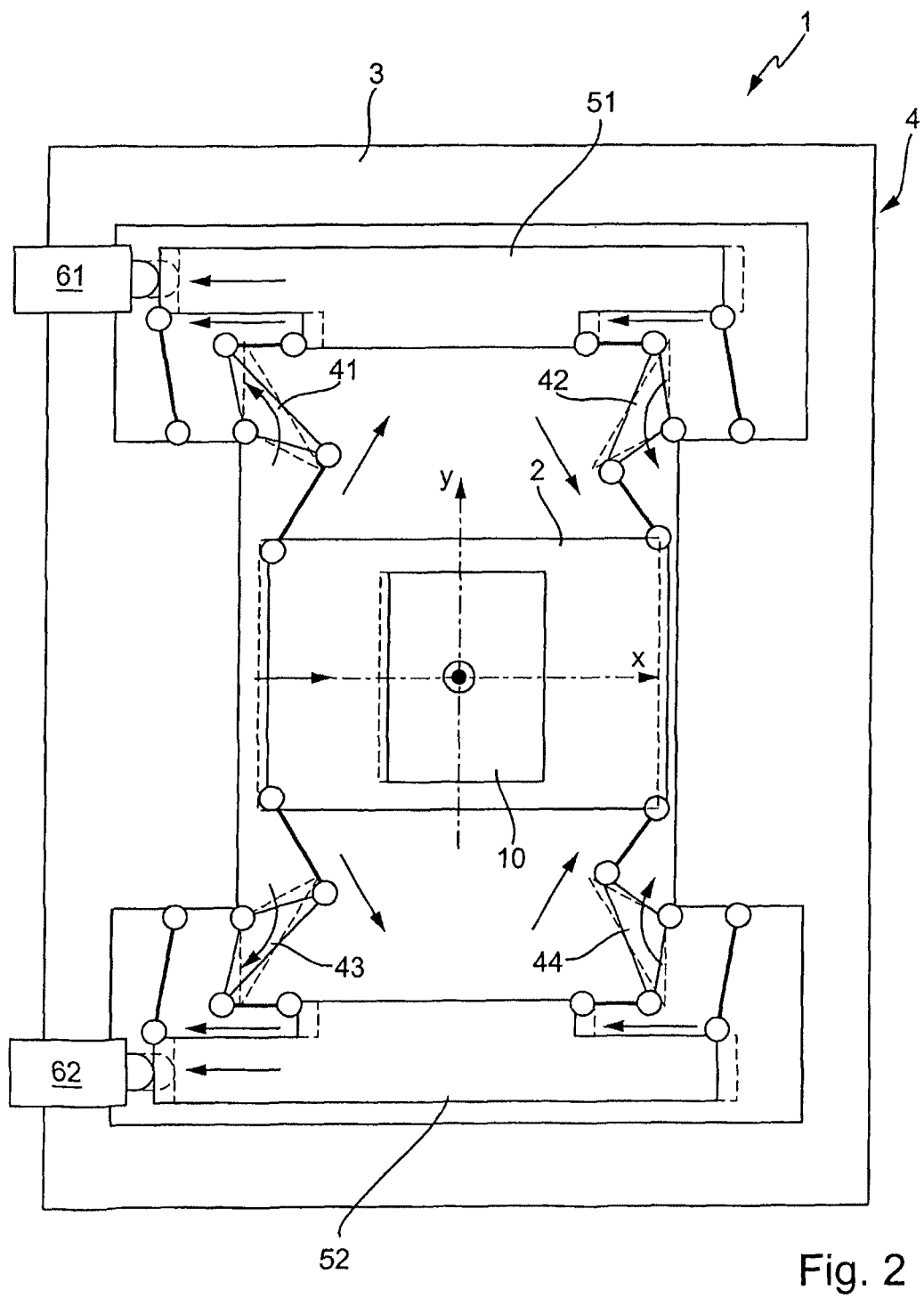
FIG. 2 is a schematic plan view onto the manipulator unit according to FIG. 1 during a displacement of the optical element along an x axis.

FIG. 2 shows schematically a displacement of the inner structure 2 with the optical element 10 in an x direction. For this purpose, the adjusting units 61, 62 are driven in such a way that the parallel rockers 51, 52 are displaced in the negative X direction, as illustrated by arrows. The pivot arms 41, 42, which are connected to the parallel rocker 51, are positioned, viewed in the positive y direction, below the parallel rocker 51. On account of the displacement of the parallel rockers 51, 52 in the negative x direction, the pivot arms 41, 42, which are associated with the parallel rocker 51, are swivelled in the anticlockwise direction. The pivot arms 43, 44, which are associated with the second parallel rocker 52, are on the other hand positioned, viewed in the positive y direction, above the parallel rocker 52 and are swivelled in the clockwise direction on account of the displacement of the parallel rocker in the negative x direction. The swivelling of the pivot arms 41 to 44 causes the inner structure 2 with the optical element 10 to be displaced in relation to the basic structure 3 in the positive x direction.

Figure 3:
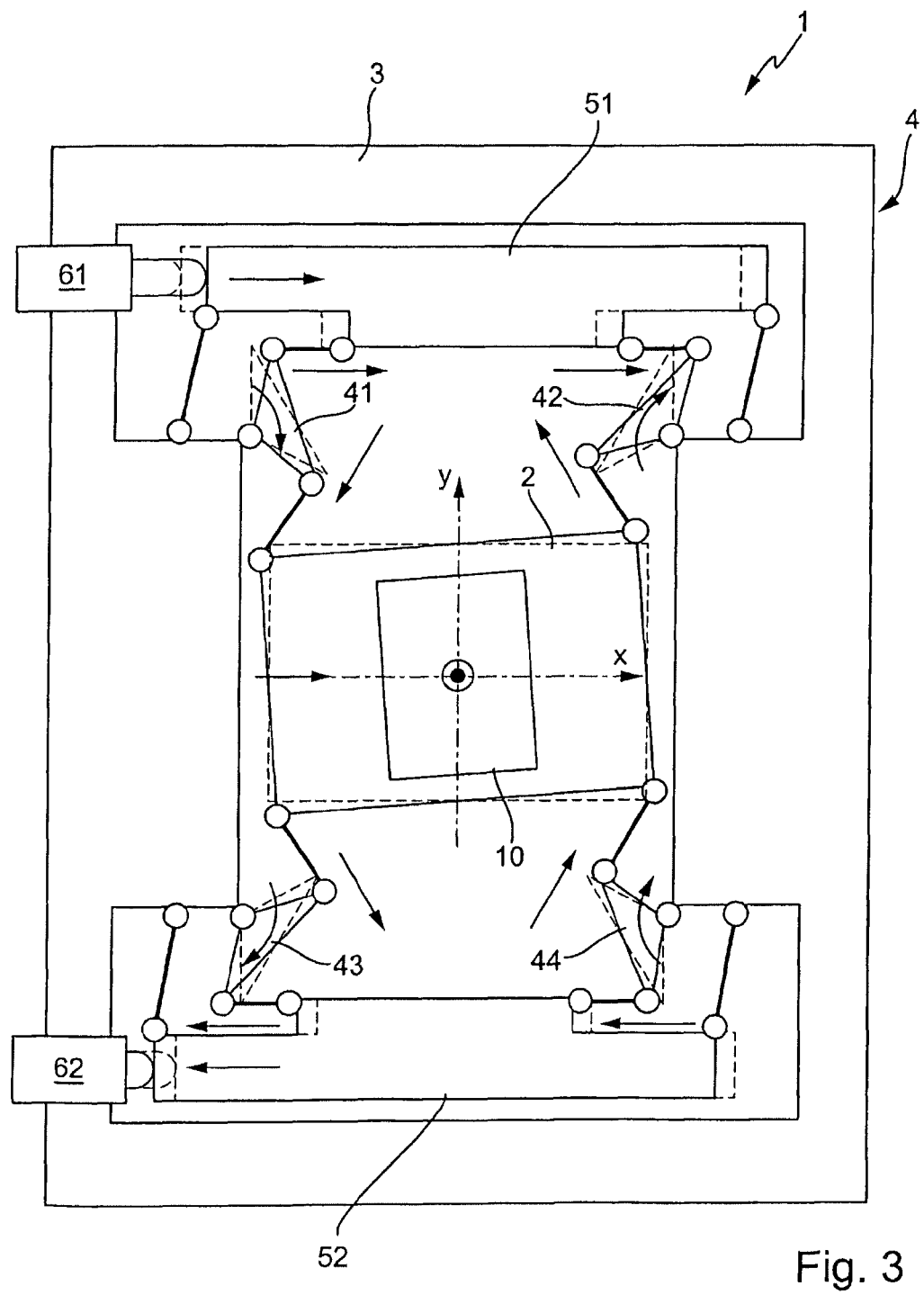
FIG. 3 is a schematic plan view onto the manipulator unit according to FIG. 1 during rotation of the optical element about a z axis.

FIG. 3 shows schematically a drive of the adjusting units 61, 62 in order to cause a rotational movement of the inner structure 2 and thus of the optical element 10 about the z axis. In the illustrated exemplary embodiment, a positive rotational movement about the z axis corresponds to rotation in the anticlockwise direction. In order to cause a rotational movement of this type, the adjusting unit 61, which is associated with the parallel rockers 51 arranged in the positive y direction (as illustrated at the top of FIG. 3), is operated in such a way that the associated parallel rocker 51 is displaced in the positive x direction. The second adjusting unit 62 is on the other hand operated in such a way that the associated parallel rocker 52 is displaced in the negative x direction. The displacement of the parallel rockers 51, 52 in two different directions causes all the pivot arms 41, 42, 43, 44 to make rotational movement in the same direction of rotation. In the illustrated exemplary embodiment, all the pivot arms 41 to 44 are made to move in rotation in the clockwise direction as a result of the illustrated movement of the parallel rockers 51, 52. The transmission of the rotational movements of the pivot arms 41 to 44 to the inner structure 2 causes the inner structure 2 to be adjusted, as illustrated, by a positive rotational movement about the z axis.

On use of the optical element 10 in an installation for recrystallization for a silicon panel, very high light power occurs on the optical element 10. The optical element 10 can therefore be heated on account of the high light power. In the illustrated exemplary embodiment, the coupling units 4a to 4d are arranged point-symmetrically to the center 0 in order to prevent decentring during point-symmetrical expansion of the optical element 10 on account of heating.

Figure 4:
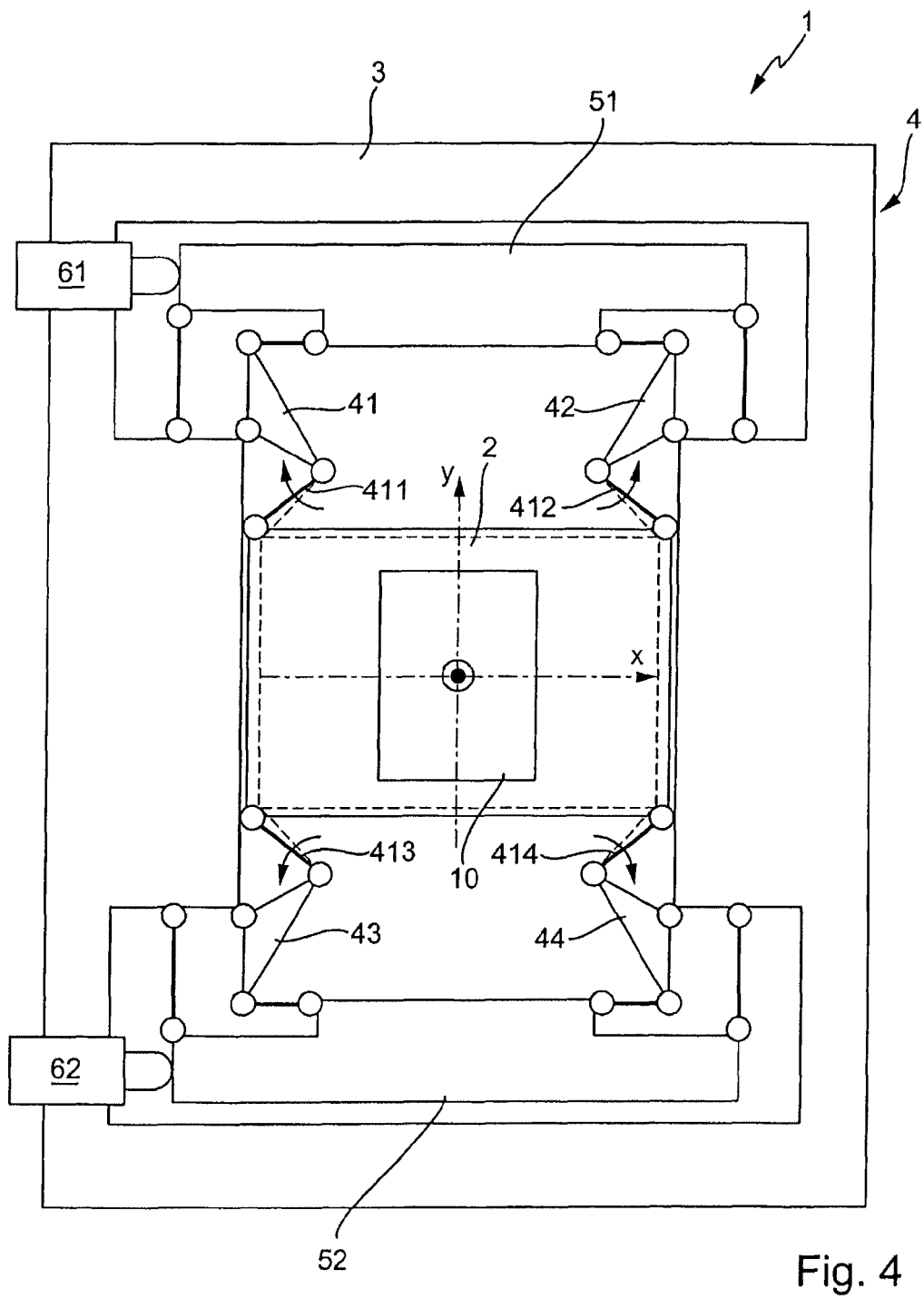
FIG. 4 is a schematic plan view onto the manipulator unit according to FIG. 1 during deformation of the optical element due to heating.

FIG. 4 shows schematically a radial expansion of the optical element 10 and the inner structure 2 connected thereto on account of heating. The radial expansion causes the coupling rods 411, 412, 413 and 414, which are arranged between the inner structure 2 and the pivot arms 41 to 44, to carry out a compensating swivelling movement and in this way to compensate for centric expansion of the inner structure 2 without decentring the optical element 10. The coupling rods 411, 412, 413, 414 are arranged substantially tangentially to an imaginary periphery around the center 0. The coupling rods 411, 412, which are each associated with a common parallel rocker 51, 52, are in this case arranged in such a way that the coupling rods 411, 412 are swivelled in opposite directions on account of the expansion. In this case, any forces acting on the parallel rocker on account of the swivelling of the coupling rods 411, 412 cancel one another out. During the expansion, it is therefore possible for the coupling rods 411, 412, 413, 414 to yield, as illustrated, in the radial direction of the imaginary periphery and in this way to compensate for the expansion on account of heating without decentring the optical element 10.

Figure 5:
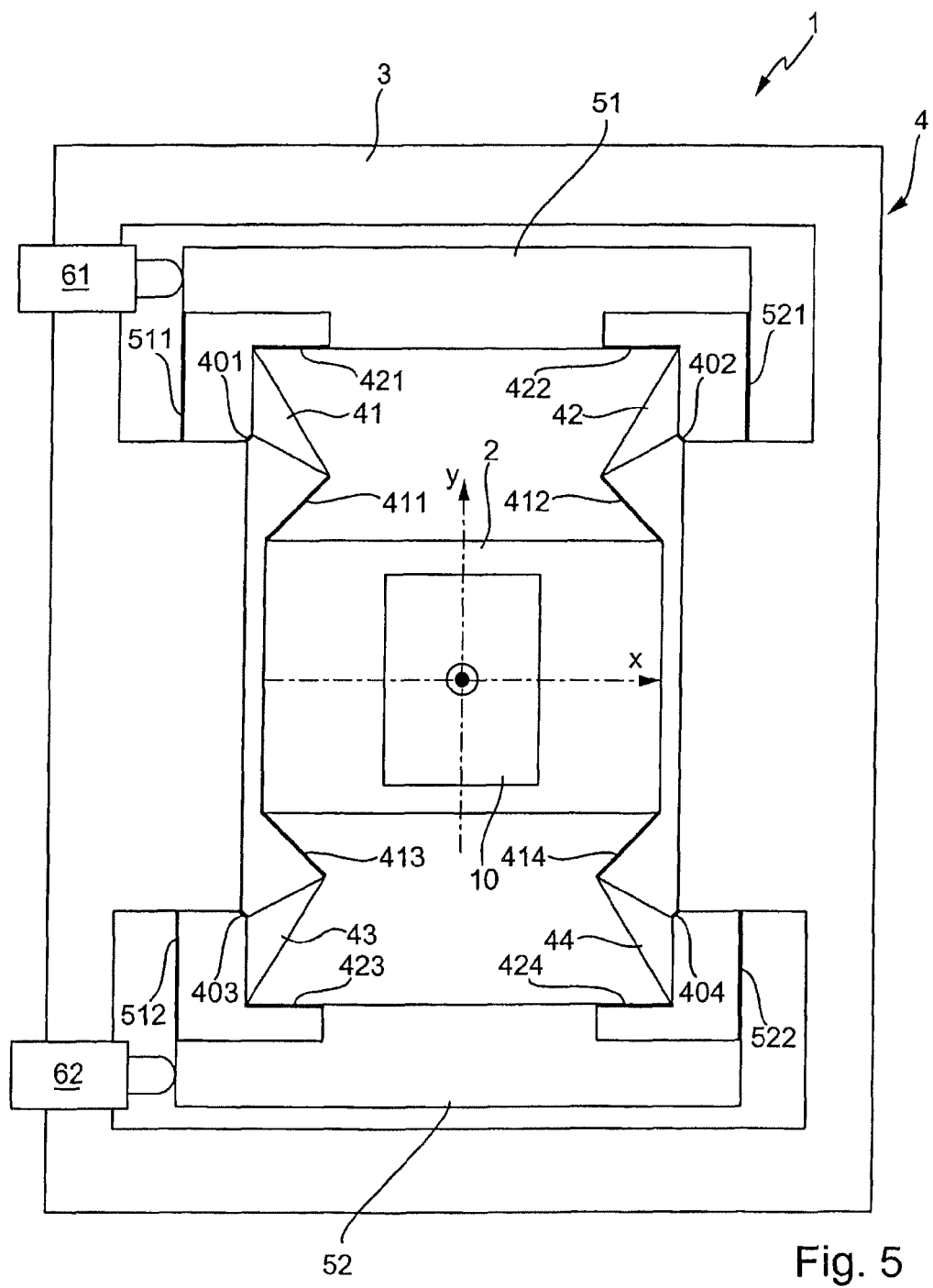
FIG. 5 is a schematic plan view onto a manipulator element, which is similar to FIG. 1.

FIG. 5 shows schematically a second exemplary embodiment of a manipulator 1 according to the disclosure. The manipulator unit 1 according to FIG. 5 corresponds substantially to the manipulator unit 1 according to FIGS. 1 to 4. Uniform reference numerals are used for identical or similar components and these components will not be described in detail. In the embodiment according to FIG. 5, joint locations between the pivot arms 41 to 44 and the inner structure 2, the basic structure 3 and the parallel rockers 51, 52 are each implemented by fixed body joints, in particular by fixed body tilting joints. Likewise, the coupling rods 411 to 414, 421 to 424, 511, 512, 521, 522 are replaced by leaf spring joints.

A manipulator unit 1 according to FIG. 5 with fixed body joints can be manufactured in a particularly compact manner, ensuring high precision. Instead of the leaf spring joints, it is also conceivable to provide coupling rods each having fixed body tilting joints at their ends.

What is claimed is:
1. A holding arrangement, comprising:
a basic structure configured to surround an optical element;
a mounting device by which the optical element can be supported on the basic structure, the mounting device having a degree of freedom for a rotational movement about an optical axis, the mounting device having a degree of freedom for a translational movement along a first axis which extends perpendicularly to the optical axis and intersects the optical axis in a center, the mounting device having four joint locations arranged point-symmetrically with respect to the center;
four pivot joints;
four pivot arms, each joint location having a corresponding pivot arm configured to be coupled with the optical element, each pivot arm being connected to the basic structure via a corresponding pivot joint; and
two parallel rockers, each parallel rocker being displaceable parallel to the first axis, each parallel rocker being connected to the basic structure, each parallel rocker having a corresponding two pivot arms articulated thereto,
wherein the two parallel rockers are configured so that a movement of the two parallel rockers in opposite directions causes the optical element to rotate about the optical axis.

2. The holding arrangement of claim 1, further comprising an inner structure configured to carry the optical element, wherein the mounting device is configured to act on the inner structure.

3. The holding arrangement of claim 2, further comprising four coupling rods, wherein each pivot arm is connected to the inner structure via a corresponding coupling rod.

4. The holding arrangement of claim 3, wherein each coupling rod is arranged substantially perpendicularly to a connecting line between its corresponding joint location and the center.

5. The holding arrangement of claim 2, further comprising four leaf spring joints, wherein each pivot arm is connected to the inner structure via a corresponding leaf spring joint.

6. The holding arrangement of claim 1, further comprising a coupling rod which connects a parallel rocker to the basic structure.

7. The holding arrangement of claim 1, further comprising two coupling rods which connect a parallel rocker to the basic structure.

8. The holding arrangement of claim 1, further comprising four coupling rods, each parallel rocker being connected to the basic structure via a corresponding two coupling rods.

9. The holding arrangement of claim 1, further comprising a coupling rod which connects a pivot arm to its corresponding parallel rocker.

10. The holding arrangement of claim 9, wherein the coupling rod is substantially parallel to its corresponding parallel rocker in a basic position.

11. The holding arrangement of claim 1, further comprising four coupling rods, each pivot arm being connected to its corresponding parallel rocker via a corresponding coupling rod.

12. The holding arrangement of claim 11, wherein each coupling rod is substantially parallel to its corresponding parallel rocker in a basic position.

13. The holding arrangement of claim 1, wherein the mounting device is mirror-symmetric to the first axis.

14. The holding arrangement of claim 1, wherein the mounting device is mirror-symmetric to a second axis extending through the center perpendicularly to both the first axis and the optical axis.

15. The holding arrangement of claim 1, further comprising an adjusting unit configured to act on the two parallel rockers.

16. A unit, comprising:
a holding arrangement according to claim 1,
wherein the unit is a manipulator unit.

17. The unit of claim 16, wherein the holding arrangement further comprises an inner structure configured to carry the optical element, wherein the mounting device is configured to act on the inner structure.

18. The unit of claim 17, wherein the holding arrangement further comprises four coupling rods, wherein each pivot arm is connected to the inner structure via a corresponding coupling rod.

19. The unit of claim 17, wherein the holding arrangement further comprises four leaf spring joints, wherein each pivot arm is connected to the inner structure via a corresponding leaf spring joint.

20. A holding arrangement, comprising:

an optical element;

a basic structure surrounding the optical element;

a mounting device by which the optical element is supported on the basic structure, the mounting device having a degree of freedom for a rotational movement about an optical axis, the mounting device having a degree of freedom for a translational movement along a first axis which extends perpendicularly to the optical axis and intersects the optical axis in a center, the mounting device having four joint locations arranged point-symmetrically with respect to the center;

four pivot joints;

four pivot arms, each joint location having a corresponding pivot arm coupled with the optical element, each pivot arm being connected to the basic structure via a corresponding pivot joint; and two parallel rockers, each parallel rocker being displaceable parallel to the first axis, each parallel rocker being connected to the basic structure, each parallel rocker having a corresponding two pivot arms articulated thereto, wherein the two parallel rockers are configured so that a movement of the two parallel rockers in opposite directions causes the optical element to rotate about the optical axis.

* * * * *